(12) United States Patent
Liu et al.

(10) Patent No.: US 12,717,433 B2
(45) Date of Patent: Aug. 25, 2026

(54) DISPLAY PANEL AND DISPLAY DEVICE

(71) Applicant: BOE Technology Group Co., Ltd., Beijing (CN)

(72) Inventors: Liyan Liu, Beijing (CN); Jaegeon You, Beijing (CN); Xuefei Sun, Beijing (CN); Yingtao Wang, Beijing (CN); Qian Jia, Beijing (CN); Xinxing Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 318 days.

(21) Appl. No.: 18/704,074

(22) PCT Filed: May 25, 2023

(86) PCT No.: PCT/CN2023/096250
§ 371 (c)(1),
(2) Date: Apr. 24, 2024

(87) PCT Pub. No.: WO2023/246419
PCT Pub. Date: Dec. 28, 2023

(65) Prior Publication Data

US 2026/0161241 A1 Jun. 11, 2026

(30) Foreign Application Priority Data

Jun. 20, 2022 (CN) ......................... 202210701428.3

(51) Int. Cl.
*G06F 3/041* (2006.01)
*H10K 59/40* (2023.01)

(52) U.S. Cl.
CPC ........... *G06F 3/0412* (2013.01); *H10K 59/40* (2023.02); *G06F 2203/04112* (2013.01)

(58) Field of Classification Search
CPC ......... G06F 3/0412; G06F 2203/04112; H10K 59/40
(Continued)

(56) References Cited

U.S. PATENT DOCUMENTS 7,538,288 B1 * 5/2009 Huang .................... G06F 3/045 200/600
9,240,297 B2 * 1/2016 Lee ...................... H01H 13/704
(Continued)

FOREIGN PATENT DOCUMENTS

CN 107831937 A 3/2018
CN 109324709 A 2/2019
(Continued)

OTHER PUBLICATIONS

International Search Report for PCT/CN2023/096250 Mailed Aug. 7, 2023.

*Primary Examiner* — Calvin C Ma

(57) ABSTRACT

A display panel and a display device, includes a punching area (1), a hole peripheral area (2) and a remaining area (3), and the hole peripheral area (2) being arranged around the punching area (1). The display panel includes a touch metal layer, wherein the touch metal layer includes staggered metal meshes; a line width of a metal mesh of the touch metal layer that is located in the hole peripheral area (2) is greater than a line width of a metal mesh of the touch metal layer that is located in the remaining area (3); and the hole peripheral area (2) includes at least two compensation areas, line widths of the metal meshes in adjacent compensation areas are different and are both larger than the line width of the metal mesh in the remaining area (3).

15 Claims, 5 Drawing Sheets

(58) Field of Classification Search
USPC .......................................................... 345/173
See application file for complete search history.

(56) References Cited

U.S. PATENT DOCUMENTS

| | | | | |
|---|---|---|---|---|
| 11,947,762 | B2 * | 4/2024 | Wang | G06F 3/0412 |
| 2021/0223940 | A1 * | 7/2021 | Li | G06F 3/04164 |

FOREIGN PATENT DOCUMENTS

| | | | |
|---|---|---|---|
| CN | 114063808 | A | 2/2022 |
| CN | 115101557 | A | 9/2022 |
| WO | 2022087820 | A1 | 5/2022 |

* cited by examiner

DISPLAY PANEL AND DISPLAY DEVICE

CROSS-REFERENCE TO RELATED APPLICATIONS

The present application is a U.S. National Phase Entry of International Application PCT/CN2023/096250 having an international filing date of May 25, 2023, which claims priority to Chinese Patent Application No. 202210701428.3 filed to the CNIPA on Jun. 20, 2022 and entitled "DISPLAY PANEL AND DISPLAY DEVICE", and the contents disclosed in the above-mentioned applications are hereby incorporated as a part of this application.

TECHNICAL FIELD

Embodiments of the present disclosure generally relate to, but are not limited to, the field of display technologies, and particularly to a display panel and a display apparatus.

BACKGROUND

Limited by product requirements such as flexible folding and narrow bezel, etc., a touch structure layer of an OLED is in a form of Flexible Multi-Layer On Cell (FMLOC). A flexible touch structure layer is provided on an encapsulation layer of the OLED backplate, and has the advantages of lightness, thinness and foldability. Based on the consideration of reducing resistance and improving sensitivity, the electrodes in the touch structure layer are in a form of metal mesh 10. Compared with using a transparent conductive material (such as Indium Tin Oxide (ITO)) to form a touch electrode, the metal mesh 10 has the advantages of low resistance, less thickness and fast response speed. For the sake of thinning products and increasing capacitor load, a single-layer metal mesh 10 is designed as a Flexible Single Layer On Cell (FSLOC) structure.

An FMLOC metal mesh is generally manufactured with a Ti/Al/Ti material, and a metal mesh pattern formed by the FMLOC metal mesh may be selected according to actual needs. However, due to a limitation to process conditions around a hole of an OLED FMLOC product, an actual line width of the FMLOC metal mesh deviates from a designed line width, and the actual line width is slightly smaller than the designed line width due to the limitation to process conditions around the hole. In order to avoid this difference/difference value in line width, CD compensation design is made, that is, a hole peripheral area is provided. However, in a condition of dark state and strong reflected light, an optical undesirable phenomenon with obvious boundary of bright and dark areas occurs between an area with the CD compensation design and the area without CD compensation design (normal area).

This optical undesirable phenomenon with obvious boundary of the bright and dark areas is caused by the metal mesh blocking anode reflection in side view. According to a test method on a right side of FIG. 1, when the side is illuminated at about 45 degrees and a human eye observes at about 135 degrees, it can be seen that the boundary of bright and dark areas has obvious poor optical reflection, resulting in the situation shown on a left side of FIG. 1.

SUMMARY

The following is a summary of subject matter described in the present disclosure in detail. This summary is not intended to limit the protection scope of claims.

A display panel is provided in an embodiment of the present disclosure, which includes a punching area, a hole peripheral area, and a remaining area, wherein the hole peripheral area is disposed around the punching area, and the remaining area is an area in the display panel other than the punching area and the hole peripheral area, the display panel includes a touch metal layer, wherein the touch metal layer includes staggered metal meshes, and a line width of a metal mesh in the touch metal layer, which is located in the hole peripheral area, is larger than a line width of a metal mesh in the remaining area;

the hole peripheral area includes at least two compensation areas, and line widths of metal meshes in two adjacent compensation areas are different and larger than the line width of the metal mesh in the remaining area.

In an exemplary implementation, the hole peripheral area includes a plurality of compensation areas, a difference between a line width of a metal mesh in each of the compensation areas and the line width of the metal mesh in the remaining area is less than or equal to 0.7 microns.

In an exemplary implementation, line widths of metal meshes in a plurality of the compensation areas are not identical.

In an exemplary implementation, the difference between line widths of metal meshes in any two adjacent compensation areas is less than or equal to 0.7 microns.

In an exemplary implementation, the difference between line widths of metal meshes in any two adjacent compensation areas is less than or equal to 0.2 microns.

In an exemplary implementation, the plurality of compensation areas include a first compensation area and a second compensation area, wherein the second compensation area is closer to the remaining area, compared with the first compensation area, and a line width of a metal mesh in the first compensation area is larger than a line width of a metal mesh in the second compensation area.

In an exemplary implementation, the hole peripheral area is divided into a plurality of the compensation areas in a first direction of the display panel, and line widths of metal meshes in the compensation areas gradually increase in a direction away from the remaining area.

In an exemplary implementation, the hole peripheral area is divided into a plurality of compensation areas in a second direction of the display panel, and line widths of metal meshes in the compensation areas gradually increase in a direction from a middle of the hole peripheral area to both ends of the hole peripheral area.

In an exemplary implementation, each of the compensation areas has a same width in the first direction or the second direction.

In an exemplary implementation, the hole peripheral area is divided into a plurality of grid-shaped compensation areas in a first direction and a second direction of the display panel, line widths of metal meshes in the compensation areas gradually increase in a direction away from the remaining area, and the line widths of metal meshes in the compensation areas gradually increase in a direction from a middle of the hole peripheral area to both ends of the hole peripheral area.

In an exemplary implementation, each of the compensation areas has a same width in the first direction or the second direction.

In an exemplary implementation, at least three compensation areas are provided in the hole peripheral area.

In an exemplary implementation, the display panel includes a display layer and a touch structure layer disposed on the display layer, and the touch metal layer is disposed on the touch structure layer.

A display apparatus is also provided in an embodiment of the disclosure, which includes any of the above-mentioned display panels, wherein the display panel is provided with a photosensitive apparatus, and the photosensitive apparatus is disposed in the punching area.

In an exemplary implementation, the photosensitive apparatus includes a camera.

Other aspects of the present disclosure may be comprehended after the drawings and the detailed descriptions are read and understood.

DETAILED DESCRIPTION

Figures 1, 2:
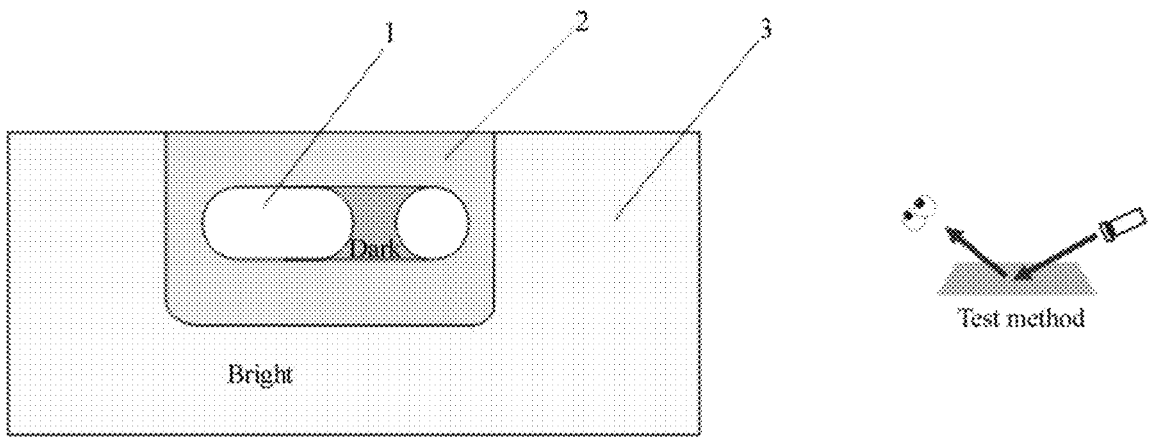
FIG. 1 shows an undesirable bright-dark partitioning phenomenon.
FIG. 2 is an analysis on the undesirable bright-dark partitioning phenomenon in an embodiment of the present disclosure.

The present application will be further described below in combination with the drawings and the embodiments in detail. It is to be understood that the embodiments described herein are only intended to explain relevant disclosure, and that these embodiments are exemplary and not limiting to the disclosure. For the convenience in description, only those parts related to the present disclosure are illustrated in the drawings.

It should be noted that the embodiments in the present application and features in the embodiments may be combined with each other if there is no conflict. The present application will be described in combination with the drawings and the embodiments in detail.

Referring to FIG. 3 to FIG. 5 and FIG. 8, a display panel is provided in an embodiment of the present disclosure, which includes a punching area 1, a hole peripheral area 2 and a remaining area 3. The hole peripheral area 2 is disposed around the punching area 1, and the remaining area 3 is an area in the display panel other than the punching area 1 and the hole peripheral area 2.

The display panel includes a touch metal layer, wherein the touch metal layer includes staggered metal meshes 10, and a line width of a metal mesh 10 in the touch metal layer, which is located in the hole peripheral area 2, is larger than a line width of a metal mesh 10 in the remaining area 3.

The hole peripheral area 2 includes at least two first compensation areas 5, and line widths of metal meshes 10 in adjacent first compensation areas 5 are different and larger than the line width of the metal mesh 10 in the remaining area 3.

In the embodiment of the present disclosure, by providing at least two compensation areas in the hole peripheral area 2 on the display panel, configuring the line widths of the metal meshes 10 in the compensation areas to be larger than the line width of the metal mesh 10 in the remaining area, and configuring the line width of the metal mesh 10 in the hole peripheral area 2 to be adjusted and compensated by the compensation area, an optically undesirable phenomenon of dark state reflection does not occur between the compensated hole peripheral area 2 and remaining area 3, and display brightness and darkness of the display panel are homogeneous.

Figure 3:
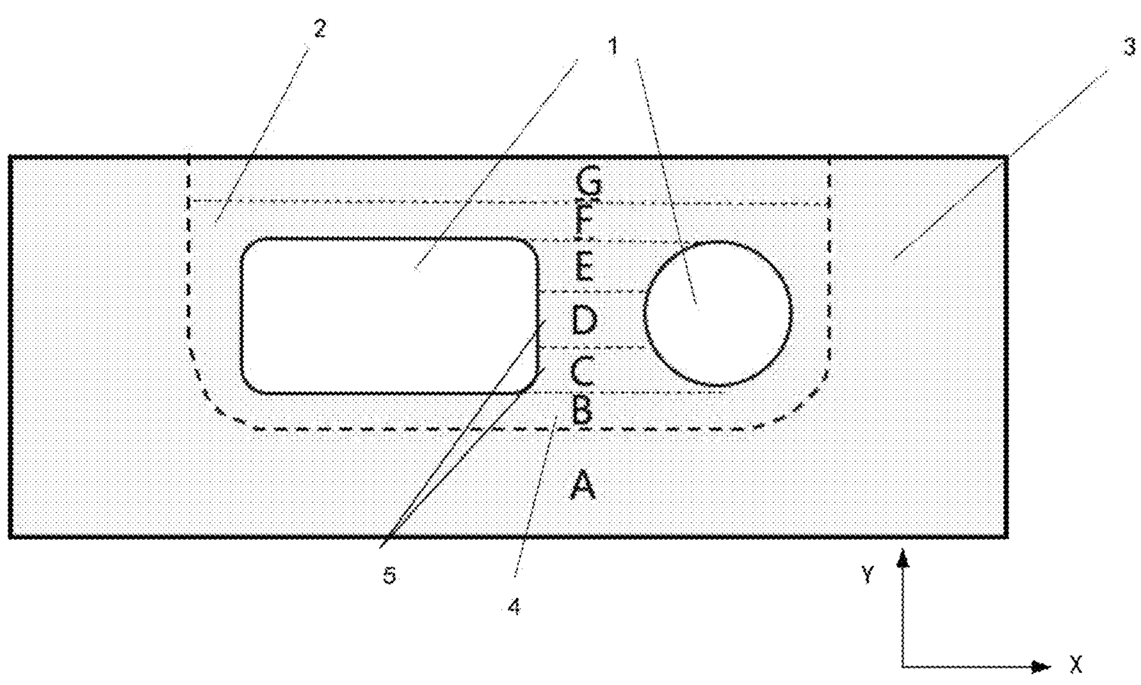
FIG. 3 is a schematic diagram of division of a display panel in an embodiment of the present disclosure.
Figure 4:
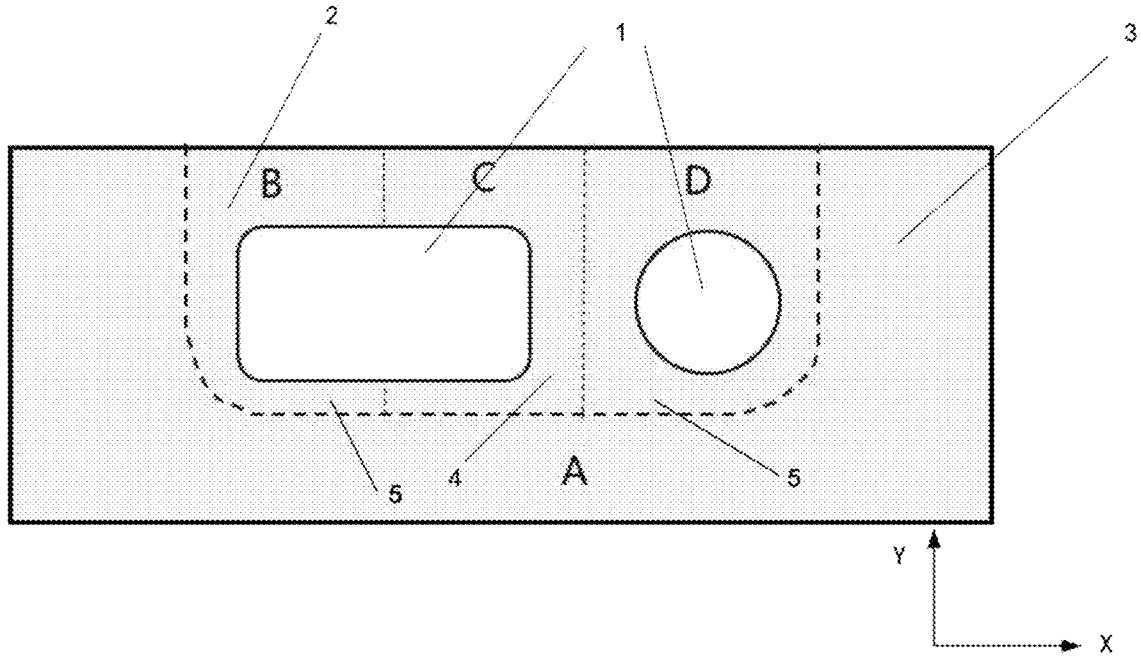
FIG. 4 is a schematic diagram of division of another display panel in an embodiment of the present disclosure.
Figure 5:
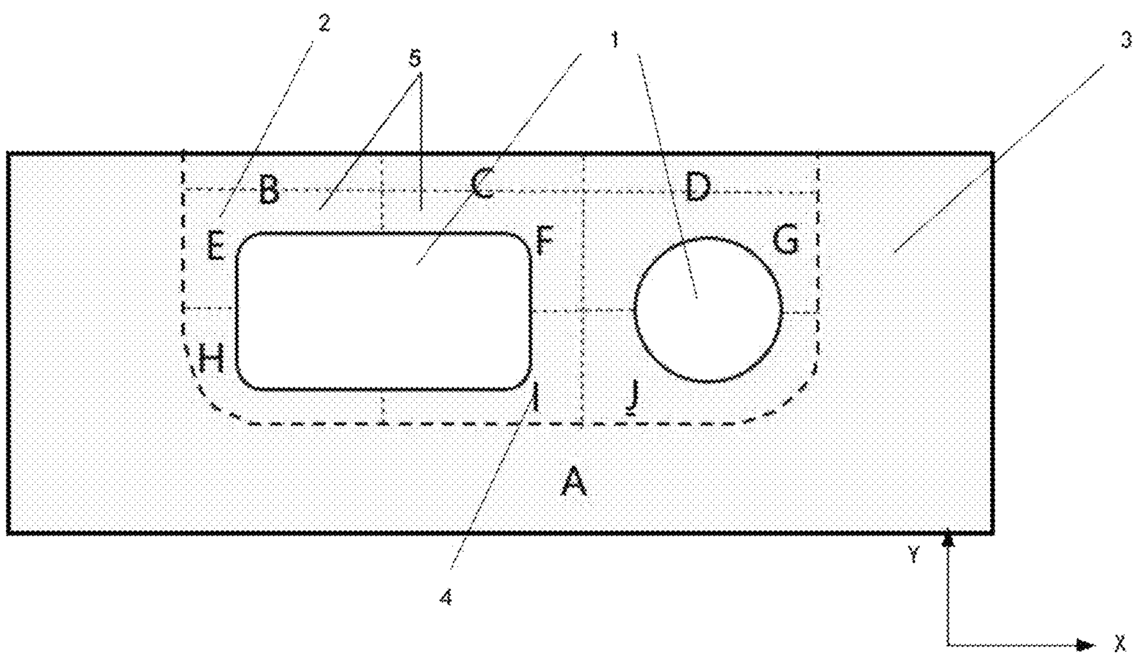
FIG. 5 is a schematic diagram of division of yet another display panel in an embodiment of the present disclosure.

A display panel according to an embodiment of the present disclosure is divided into three portions according to a punching position on the display panel. Referring to FIGS. 3 to 5, the three portions include the punching area 1, the hole peripheral area 2, and the remaining area 3. The punching area 1 is determined according to a punching position. The hole peripheral area 2 is disposed around the punching area 1, and is generally at a position extending 3 mm from an edge of the punching area 1 in the direction away from the hole. The area on the display panel other than the punching area 1 and the hole peripheral area 2 is the remaining area 3.

The touch metal layer on the display panel is achieved by an interlaced metal meshes 10. The metal mesh 10 is distributed in the remaining area 3 and the hole peripheral area 2 on the display panel, but the line width of the metal mesh 10 in the hole peripheral area 2 is smaller than the line width of the metal mesh 10 in the remaining area 3 due to a limitation on the fabrication process. Therefore, in the embodiment of the present disclosure, by providing the compensation area in the hole peripheral area 2, and configuring a line width of a metal mesh 10 in the compensation area in the hole peripheral area 2 to be larger than a line width of a metal mesh 10 in the remaining area, the brightness and darkness inhomogeneity does not occur at the compensated structure when displayed. There are at least two compensation areas in the hole peripheral area, and both of line widths of metal meshes 10 in the two compensation areas need to be compensated, and the line widths of the metal meshes 10 in the two compensation areas are larger than the line width in the remaining area, so that a line width in entire hole peripheral area can be compensated.

In an exemplary implementation, the hole peripheral area 2 includes a plurality of compensation areas, each of the compensation areas has a line width difference of the metal mesh 10 from the line width of the metal mesh 10 in the remaining area 3 of 0.7 microns or less.

In order to ensure that brightness and darkness of the hole peripheral area 2 in the embodiment of the present disclosure are relatively homogeneous under when in dark state display, and ensure a compensation effect of a compensation portion, the hole peripheral area 2 is divided into a plurality of compensation areas, the plurality of compensation areas include the first compensation area 5, each compensation area is provided with a corresponding compensation portion, and widths of compensation portions in different compensation areas are different according to different positions of the compensation areas, and a width of each compensation portion is also different. After a corresponding compensation is provided for each area, the phenomenon of brightness and darkness inhomogeneity does not occur in entire display panel in the dark state.

In the FMLOC metal mesh 10 in the hole peripheral area 2 according to the embodiment of the present disclosure, insufficient line width of actually formed metal mesh 10 occurs due to a limitation to process conditions. Therefore, it is necessary to compensate in the hole peripheral area 2 to a certain extent, so that the line width of the metal mesh 10 in the hole peripheral area 2 exceeds the line width of the metal mesh 10 in remaining area 3, so as to ensure that there is enough margin in a manufacturing process of the FMLOC metal mesh 10 and ensure that the metal mesh 10 achieves a touch function effect. As shown in FIG. 2, a figure on a left side shows incidence and emission of light without compensation, that is, a case that MMCD=+0case. Incidence and emission of light are tested with a test method shown on a right side of FIG. 1. Incident light is incident on the display panel at an included angle of 60 degrees with a normal line. A line of the metal mesh 10 is disposed at a position of an incident angle. After entering the display panel, the light is reflected by an anode layer to form emission light shown on the left side of FIG. 2.

In order to ensure the line width of the metal mesh 10, compensation needs to be performed to a certain extent. As shown in FIG. 2, a figure on a right side shows a case that a corresponding direction of light after a compensated width is provided beside the line of the metal mesh 10, that is, a case that MMCD=+Δcase. A metal line with a certain width is added at a position of radiation light at the incident angle. When incident light at a same angle enters the display panel, the line of the metal mesh 10 blocks the incident light to a certain extent, so that light reflected by the anode layer also decreases, and the dark state appears at a corresponding position relative to the case on the left side of FIG. 2. Therefore, it is necessary to reasonably configure the compensated metal line width, so that obvious brightness and darkness inhomogeneity does not occur at a position of the compensated metal mesh 10, compared with the remaining area.

Figure 6:
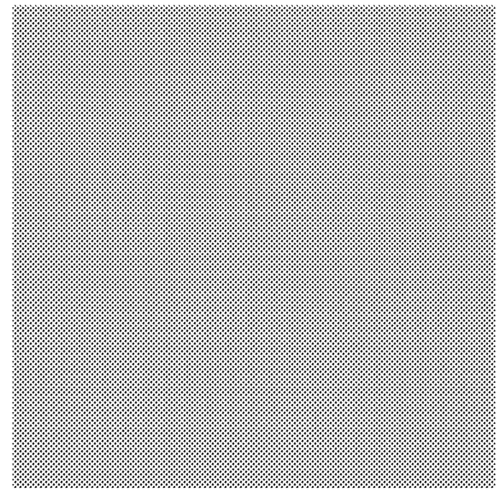
FIG. 6 illustrates an optical case of a difference between line widths of metal meshes of 0.7 microns in an embodiment of the present disclosure.
Figure 7:
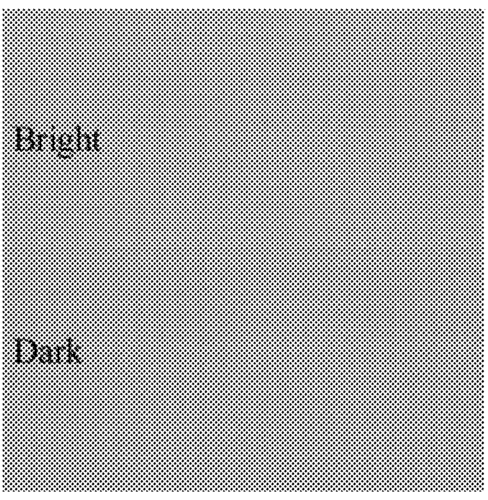
FIG. 7 illustrates an optical case of a difference between line widths of metal meshes of 0.8 microns in an embodiment of the present disclosure.
Figure 8:
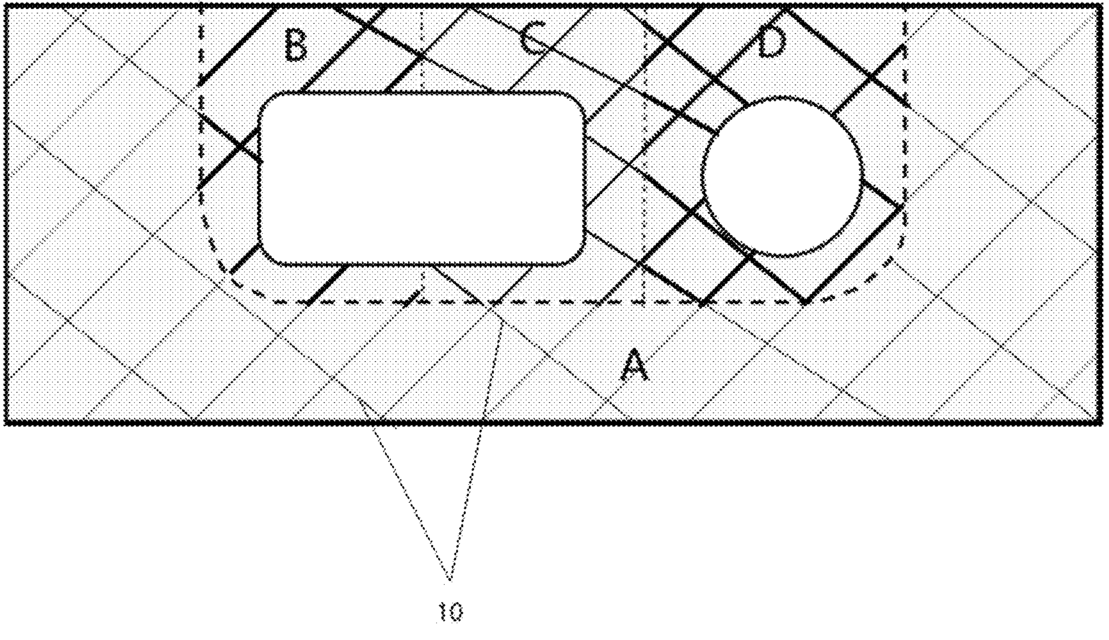
FIG. 8 is a schematic diagram of metal mesh lines in a plurality of areas in an embodiment of the present disclosure.

In the embodiment of the present disclosure, optical inhomogeneity caused by the metal mesh 10 blocking anode reflection is mitigated by changing the line width of the metal mesh 10 in the hole peripheral area 2. According to a simulation calculation, the problem of optical inhomogeneity can be solved when a difference between the line width of the metal mesh 10 in the compensation areas of the hole peripheral area 2 and the line width of the metal mesh 10 in remaining area is not more than 0.7 microns. When the difference is more than 0.7 microns, the case of brightness and darkness inhomogeneity occurs. Therefore, in an exemplary implementation, the width of the compensation portion is configured not to be more than 0.7 microns. As shown in FIGS. 6 and 7, FIG. 6 shows an optical case in which the difference between the line widths of the metal meshes 10 is 0.7, and FIG. 7 shows an optical case in which the difference between the line widths of the metal meshes 10 is 0.8. As can be seen from FIG. 7, when the difference between the line widths is more than 0.8 microns, obvious bright-dark partitioning phenomenon occurs. Therefore, in an exemplary implementation, a difference between a line width of a metal mesh 10 in each of the compensation areas and the line width of the metal mesh 10 in the remaining area is configured to be no more than 0.7 microns, so that the case on the right side of FIG. 7 does not occur.

In an exemplary implementation, the difference between line widths of metal meshes 10 in any two adjacent compensation areas is less than or equal to 0.7 microns.

In the embodiment of the present disclosure, the difference between the line widths of the metal meshes 10 in the compensation areas and the line width of the metal mesh 10 in remaining area is defined to be less than or equal to 0.7 microns, and the line widths of the metal meshes 10 in the compensation areas are not completely the same, and it is also necessary to avoid the case of brightness and darkness inhomogeneity between adjacent compensation areas. Therefore, the case of the line widths of the metal meshes 10 between adjacent compensation areas is the same as the case in the above-mentioned embodiment, and the difference between the line widths is controlled to be 0.7 microns. Based on the reasons in the above-mentioned embodiment, only by controlling the compensation areas within this domain, normal display of the display panel can be achieved, without the bright-dark partitioning phenomenon.

In an exemplary implementation, the difference between line widths of metal meshes 10 in any two adjacent compensation areas is less than or equal to 0.2 microns.

Referring to FIGS. 3 to 5, a variety of solutions for dividing compensation areas are provided in an embodiment of the present disclosure. In order to ensure that the difference between line widths of adjacent compensation areas is small and no obvious phenomenon of brightness and darkness inhomogeneity occurs, in an exemplary implementation, the difference between the line widths of the metal meshes 10 in the adjacent compensation areas is less than or equal to 0.2 microns. Therefore, when a plurality of compensation areas are provided in the hole peripheral area, the difference between line widths of adjacent compensation areas is also small, and a brightness difference between the adjacent compensation areas is also small, so that the phenomenon of brightness and darkness inhomogeneity of the display panel can be better improved.

In an exemplary implementation, the plurality of compensation areas include a first compensation area 5 and a second compensation area 4, wherein compared with the first compensation area 5, the second compensation area 4 is closer to the remaining area 3, a line width of a metal mesh 10 in the first compensation area 5 is larger than a line width of a metal mesh 10 in the second compensation area 4.

In an exemplary implementation, it is necessary to divide the hole peripheral area 2 by providing the compensation areas in the hole peripheral area 2 to achieve the change of the line width of the metal mesh 10. Since obvious bright and dark partitions appear in a middle part, close to the remaining area 3, of a lower part of the hole peripheral area 2, it is necessary to at least provide compensation areas in this area to compensate the line width of the metal mesh 10 to a certain extent. In an exemplary implementation, the first compensation area 5 and the second compensation area 4 are provided, wherein the second compensation area 4 is disposed at a position of the middle part, close to the remaining area 3, of the lower part of the hole peripheral area 2, and the first compensation area 5 compensates the line width of the metal mesh 10 in the second compensation area 4, so that the brightness and darkness of the display panel are more homogeneous when displaying in the dark state.

In the embodiment of the present disclosure, at least two compensation areas are provided in the hole peripheral area 2, and the compensation areas are disposed at a position where the brightness and darkness inhomogeneity is most obvious, that is, the position of the middle part, close to the remaining area 3, of the lower part of the hole peripheral area 2, and the difference between the line width of the metal mesh 10 at the position of the compensation areas and the line width of the metal mesh 10 in the remaining area is minimal, so as to have best compensation effect. When the compensation areas are provided in the hole peripheral area 2, the entire hole peripheral area 2 may be divided into a first compensation area 5 and a second compensation area 4, or may be divided into a plurality of different compensation areas as required, and compensation values of different widths may be employed for compensation. No matter how many compensation areas are provided, in an exemplary implementation, the difference between the line width of the metal mesh 10 in the first compensation area 5 and the line width of the metal mesh 10 in the remaining area is configured to be minimal, so that a better improvement effect occurs at this position.

In an exemplary implementation, the hole peripheral area 2 is divided into a plurality of the compensation areas in a first direction of the display panel, line widths of the metal meshes 10 in the compensation areas gradually increase in a direction away from the remaining area 3.

As shown in FIG. 3, a method for dividing compensation areas is provided in an embodiment of the present disclosure, which divides into partitions in the first direction of a display panel, and the first direction herein refers to a Y-axis direction shown in the figure. In this method, each partition extends along an X-axis to form a plurality of areas parallel to the X-axis, and a quantity of partitions can be determined according to an actual size of the display panel. In an exemplary implementation, at least three compensation areas are provided in the hole peripheral area 2. The more the quantity of compensation areas, the brightness gradually changes, the less obvious light-dark partitioning phenomenon between the compensated areas, the better the compensation effect, and the optical inhomogeneity on the display panel does not occur. Generally, three to seven transverse compensation areas are provided without the limitation to the process conditions.

In an embodiment of the present disclosure, six compensation areas are provided, and the partition mode may be that each transverse small area is evenly distributed in a partitioning direction, and areas B, C, D, E, F and G shown in FIG. 3 are transverse small areas with evenly distributed sizes. It may also be a non-evenly distributed dimensions that each transverse small area moves up or down in the partitioning direction according to the process conditions. In an exemplary implementation, widths of the compensation areas are set to the same in the first direction. Considering the limitation to the process conditions of the hole peripheral area 2, the line width of the compensation area is considered to be larger than the line width of the area A (i.e., the remaining area 3) during the design and manufacturing, which compensates the limitation to the process conditions, so that there is no large difference between the line width of the hole peripheral area 2 and the line width of the remaining area 3 on the manufactured display panel, and a line width difference at a boundary of each compensation area is less than or equal to 0.7 um. For example, the line widths of the metal meshes 10 in the small transverse areas B, C, D, E, F, G in FIG. 3 is set to be gradually larger in turn than the line width of the area A, so as to maximally eliminate the optical inhomogeneity. For example, when the differences between the line widths of the metal meshes 10 in the areas B, C, D, E, F and G and the line width of the area A is set to be 0.1 um, 0.2 um, 0.3 um, 0.4 um, 0.5 um and 0.6 um, the optical inhomogeneity is eliminated maximally.

In an exemplary implementation, the hole peripheral area 2 is divided into a plurality of the compensation areas in a second direction of the display panel, the line widths of the metal meshed of the compensation areas gradually increase in a direction from the middle of the hole peripheral area to both ends.

As shown in FIG. 4, another method for dividing compensation areas is provided in an embodiment of the present disclosure, in which compensation areas are divided in the second direction of the display panel, and each compensation area is disposed in a vertical direction. The second direction herein refers to an X-axis direction shown in the figure, and each compensation area extends along the Y-axis to form a plurality of areas perpendicular to the X-axis. A quantity of compensation areas can be determined according to the actual size of the display panel. In an exemplary implementation, at least three compensation areas are provided within the hole peripheral area 2. The more the compensation areas, the less obvious light-dark partitioning phenomenon between the compensation areas, the better the compensation effect, and the optical inhomogeneity on the display panel does not occur. Generally, three to seven vertical compensation areas are provided without the limitation to the process conditions.

In an embodiment of the present disclosure, three compensation areas are provided, and a method for partitioning may be that each vertical small area is assigned a size in a partitioning direction. In an exemplary implementation, the widths of the compensation areas are set to the same width in the second direction. As shown in FIG. 3, the areas B, C and D are small vertical areas with average distributed size. It may also be a non-evenly distributed dimensions that each vertical small area moves left or right in the partitioning direction according to the process conditions. Similar to the above-mentioned transverse partitioning, considering the limitation of the process conditions, the line widths of the areas B, C and D is larger than the line width of the area A (i.e., the remaining area 3), and line width differences at boundaries are less than or equal to 0.7 um. The line widths of the metal meshes 10 in the vertical small area in FIG. 4 is set so that the line widths of the metal meshes 10 increases in turn from the area C at a center position to the areas B and D on both sides, which maximally eliminates the optical inhomogeneity. For example, the optical inhomogeneity can be eliminated maximally when the differences between the line widths of the areas B, C, D and the line width of the area A are set to 0.4 um, 0.2 um and 0.4 um in turn.

In an exemplary implementation, there are a plurality of divided compensation areas in a grid shape, the line widths of the metal meshes 10 in the compensation areas gradually increase in the direction away from the remaining area 3, the line widths of the metal meshes 10 in the compensation areas gradually increase in the direction from the middle of the hole peripheral area to both ends.

As shown in FIG. 5, a method for dividing compensation areas is also provided in an embodiment of the present disclosure, wherein the divided compensation areas are in a grid shape. Similar to the above-mentioned embodiment, at least three areas may be provided in the transverse direction and at least three areas may be arranged in the vertical direction, which is also similar to the above-mentioned embodiment. The quantity of compensation areas is generally in a range of 3 to 9 in a condition that the process is not limited.

In the embodiment of the present disclosure, nine compensation areas are provided, and the partition mode may be that each transverse or vertical small area is evenly distributed in the partitioning direction. As shown in FIG. 5, areas B, C, D, E, F, G, H, I and J are grid-shaped small areas with evenly distribution size. It may also be that each transverse (or vertical) small area moves up or down (left or right) according to the process conditions in the partitioning direction, which is similar to the above-mentioned partitioning. Considering the limitation to the process conditions, all of the line widths of the areas B, C, D, E, F, G, H, I and J are larger than the line width of the area A, and all of line width differences at boundaries are less than or equal to 0.7 um. In the grid-shaped small area in FIG. 5, the line widths of the metal meshes 10 are set to be larger from bottom to top and from the center position to the left and right sides in turn, which maximally eliminates the optical inhomogeneity. For example, when the difference between the line widths of the metal meshes 10 in the areas B, C, D, E, F, G, H, I and J and the line width of the metal mesh 10 in the area A is set to 0.4 um, 0.3 um, 0.4 um, 0.3 um, 0.2 um, 0.3 um, 0.2 um, 0.1 um and 0.2 um, the optical inhomogeneity is eliminated maximally.

In an embodiment of the present disclosure, three longitudinally disposed compensation areas are taken as an example, in which a schematic diagram of a metal mesh of a touch metal layer is shown, wherein the mesh is schematically illustrated with only staggered lines. Grid lines are not completely straight lines, and they are not completely identical or regular diamond-shaped structures. The shapes of lines and the shapes formed between lines can be adjusted according to the arrangement of pixels. The line widths of metal meshes in a plurality of compensation areas are not completely the same, and the line widths are larger than the line width in the remaining area. The difference between a line width of a metal mesh in a middle compensation area and the line width of the metal mesh in remaining area is the smallest. Extending from the middle to both sides, the difference between a line width of a metal mesh in a compensation area and the line width of the remaining area increases, and a line width of a formed metal mesh is wider.

A display panel is also provided in an embodiment of the present disclosure, which includes a display layer and a touch structure layer disposed on the display layer, wherein the touch structure layer includes any one of the above-mentioned touch metal layer.

Figures 9, 10:
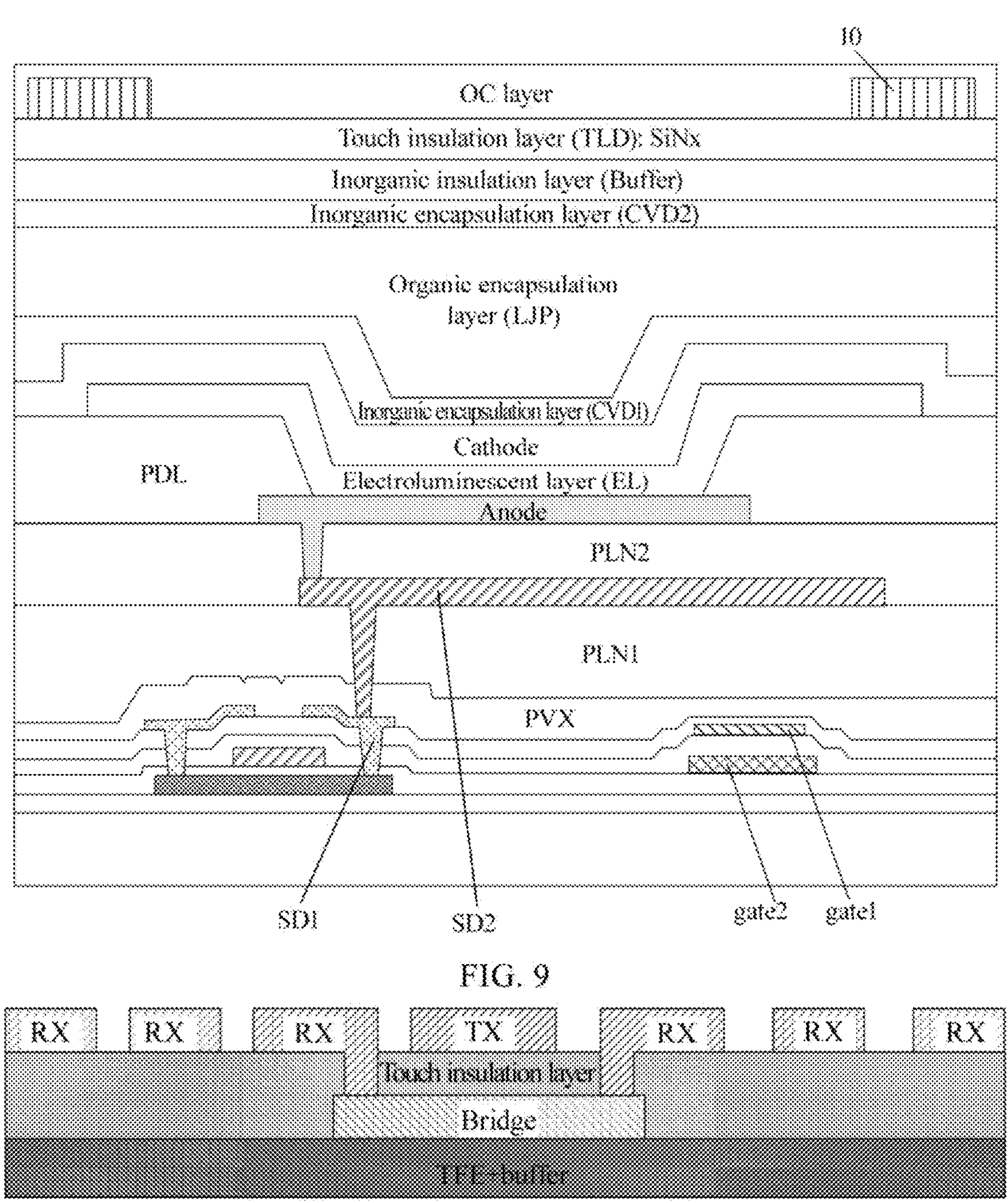
FIG. 9 is a schematic diagram of a structure of a display panel in an embodiment of the present disclosure.
FIG. 10 is a cross-sectional view of a metal mesh arrangement of a display panel in an embodiment of the present disclosure.

As shown in FIG. 9, a display panel in an embodiment of the present disclosure includes a display layer, which refers to a backplate having a base substrate, a gate layer, an active layer, a source-drain layer, an anode layer and the like disposed on the base substrate to form a thin film transistor structure, so as to form a display panel. A light emitting layer structure is formed and encapsulated on the backplate, and an FMLOC film layer (i.e. a touch structure layer) is formed on the encapsulated structure, wherein the touch structure layer includes the touch metal layer in the above-mentioned embodiments.

The touch metal layer includes staggered metal meshes 10 including TX lines and RX lines. As shown in FIG. 10, a touch insulation layer is provided below the metal meshes 10, and the RX lines are connected through a bridge structure disposed in the touch insulation layer. The line width of the metal mesh 10 in the above-mentioned embodiments refers to a line width of the TX lines and the RX lines.

According to the display panel provided in the embodiment of the present disclosure, the line widths of the metal mesh 10 in the hole peripheral area 2 are set according to the areas area division, and the line widths of the metal meshes 10 in the hole peripheral area 2 are compensated according to the areas area division, so as to mitigate the phenomenon of dark reflection optical inhomogeneity caused by the metal mesh 10 blocking anode reflection, and define the line width of the metal mesh 10 after line compensation, thereby dividing the compensation areas in a more appropriate range.

A display apparatus is also provided in an embodiment of the disclosure, which includes the display panel, wherein the display panel is provided with a photosensitive apparatus, and the photosensitive apparatus is disposed in the punching area. In an embodiment of the present disclosure, a corresponding photosensitive apparatus (e.g. a camera and the like) may be provided in the punching area of the display apparatus.

It is to be understood that the orientation or positional relationship indicated above by the terms "center," "vertical," "transverse," "upper," "lower," "front," "rear," "left," "right," "vertical," "horizontal," "top," "bottom," "inner," "outer," etc. are based on the orientation or positional relationship shown in the drawings only for ease of description and simplification of the description, and are not intended to indicate or imply that the device or element referred to must have, be constructed and operated in a particular orientation and therefore cannot be understood as limiting to the disclosure. The locative words "inside and outside" refer to the inside and outside relative to the outline of the component itself. In addition, terms "first" and "second" are used for descriptive purposes only and cannot be interpreted as indicating or implying relative importance or implicitly indicating a quantity of technical features indicated. Therefore, features defined by "first" and "second" may explicitly or implicitly include one or more such features.

The above description is only the description of the preferred embodiments of the present application and the technical principles used thereof. It should be understood by those skilled in the art that the disclosure scope involved in the present application is not limited to the technical scheme formed by the specific combination of the above technical features, but also covers other technical schemes formed by any combination of the above technical features or their equivalent features without departing from the scope of the present disclosure. For example, the technical scheme formed by replacing the above features with the technical features with similar functions disclosed in the present application (but not limited to).

The invention claimed is:

1. A display panel comprising: a punching area, a hole peripheral area, and a remaining area, wherein the hole peripheral area is disposed around the punching area, and the remaining area is an area in the display panel other than the punching area and the hole peripheral area, the display panel comprises a touch metal layer, wherein the touch metal layer comprises staggered metal meshes, and a line width of a metal mesh in the touch metal layer, which is located in the hole peripheral area, is larger than a line width of a metal mesh in the remaining area;

the hole peripheral area comprises at least two compensation areas, and line widths of metal meshes in two adjacent compensation areas are different and larger than the line width of the metal mesh in the remaining area.

2. The display panel of claim 1, wherein the hole peripheral area comprises a plurality of compensation areas, and a difference between a line width of a metal mesh in each of the compensation areas and the line width of the metal mesh in the remaining area is less than or equal to 0.7 microns.

3. The display panel of claim 2, wherein line widths of metal meshes in a plurality of the compensation areas are not identical.

4. The display panel of claim 2, wherein a difference between line widths of metal meshes in any two adjacent compensation areas is less than or equal to 0.7 microns.

5. The display panel of claim 4, wherein a difference between line widths of metal meshes in any two adjacent compensation areas is less than or equal to 0.2 microns.

6. The display panel of claim 2, wherein the plurality of compensation areas comprise a first compensation area and a second compensation area, wherein the second compensation area is closer to the remaining area, compared with the first compensation area, and a line width of a metal mesh in the first compensation area is larger than a line width of a metal mesh in the second compensation area.

7. The display panel of claim 2, wherein the hole peripheral area is divided into a plurality of the compensation areas in a first direction of the display panel, and line widths of metal meshes in the compensation areas gradually increase in a direction away from the remaining area.

8. The display panel of claim 7, wherein each of the compensation areas has a same width in the first direction.

9. The display panel of claim 7, wherein at least three compensation areas are provided in the hole peripheral area.

10. The display panel of claim 2, wherein the hole peripheral area is divided into a plurality of the compensation areas in a second direction of the display panel, and line widths of metal meshes in the compensation areas gradually increase in a direction from a middle of the hole peripheral area to both ends of the hole peripheral area.

11. The display panel of claim 2, wherein the hole peripheral area is divided into a plurality of grid-shaped compensation areas in a first direction and a second direction of the display panel, line widths of metal meshes in the compensation areas gradually increase in a direction away from the remaining area, and the line widths of metal meshes in the compensation areas gradually increase in a direction from a middle of the hole peripheral area to both ends of the hole peripheral area.

12. The display panel of claim 11, wherein each of the compensation areas has a same width in the first direction or the second direction.

13. The display panel of claim 2, wherein the display panel comprises a display layer and a touch structure layer disposed on the display layer, and the touch metal layer is disposed on the touch structure layer.

14. A display apparatus comprising: the display panel of claim 1, wherein a photosensitive apparatus is provided on the display panel, and the photosensitive apparatus is disposed in the punching area.

15. The display apparatus of claim 14, wherein the photosensitive apparatus comprises a camera.

* * * * *